(12) United States Patent
Richard

(10) Patent No.: US 8,127,211 B2
(45) Date of Patent: Feb. 28, 2012

(54) ADDING KNOWN DATA TO CRC PROCESSING WITHOUT INCREASED PROCESSING TIME

(75) Inventor: Elizabeth Anne Richard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1194 days.

(21) Appl. No.: 11/765,533

(22) Filed: Jun. 20, 2007

(65) Prior Publication Data

US 2008/0320364 A1 Dec. 25, 2008

(51) Int. Cl.
*H03M 13/00* (2006.01)
(52) U.S. Cl. ............ 714/785; 714/758; 714/807
(58) Field of Classification Search ............ 714/758, 714/785, 781, 807
See application file for complete search history.

(56) References Cited

U.S. PATENT DOCUMENTS

| | | | | |
|---|---|---|---|---|
| 5,361,266 | A | * | 11/1994 | Kodama et al. ............ 714/758 |
| 5,878,057 | A | | 3/1999 | Maa |
| 5,898,712 | A | | 4/1999 | Kodama et al. |
| 5,935,269 | A | | 8/1999 | Kodama et al. |
| 6,052,815 | A | * | 4/2000 | Zook ............ 714/758 |
| 7,103,822 | B2 | * | 9/2006 | Glaise et al. ............ 714/758 |
| 7,278,085 | B1 | * | 10/2007 | Weng et al. ............ 714/766 |
| 7,310,765 | B1 | * | 12/2007 | Feng et al. ............ 714/763 |

FOREIGN PATENT DOCUMENTS

KR 1020050110646 11/2005
* cited by examiner

*Primary Examiner* — Esaw Abraham
(74) *Attorney, Agent, or Firm* — Wade J. Brady, III; Frederick J. Telecky, Jr.

(57) ABSTRACT

Cyclic redundancy check processing is applied advantageously to a set of input data that includes an unknown data portion and a data portion that is already known before the unknown data portion becomes available. A syndrome contribution that the already-known data portion contributes to a syndrome for the set of input data is determined before the unknown data portion becomes available. When the unknown data portion becomes available, the syndrome for the set of input data is determined based on the unknown data portion and the syndrome contribution.

17 Claims, 2 Drawing Sheets

ADDING KNOWN DATA TO CRC PROCESSING WITHOUT INCREASED PROCESSING TIME

FIELD OF THE INVENTION

The invention relates generally to cyclic redundancy check (CRC) processing and, more particularly, to syndrome generation in CRC processing.

BACKGROUND OF THE INVENTION

Conventional CRC operation involves processing a data stream against a known CRC polynomial that yields a result that is nearly unique to that data stream. Modifications of bits in the data stream cause different CRC results. Consequently, if data is corrupted in delivery of the stream, the calculated CRC results will not match the expected CRC results. The width and values in the polynomial determine the strength (uniqueness) of the CRC. A next-state decoder (NSD) implements the calculation of the CRC polynomial against the incoming data. The CRC is widely applicable in many situations, for example, in endeavors that transmit, receive, store, retrieve, transfer, or otherwise communicate electronically represented digital information.

According to conventional CRC operation, and as shown in FIG. 1, a syndrome 11 contained in a feedback register (FB REG) 12 is fed back to the syndrome input 10 of the NSD 14. The NSD 14 also receives the current piece of incoming data 13. The resulting output 15 of the NSD 14 is registered into the feedback register 12, and thus becomes the next syndrome at 11 for the NSD 14 to use with the next piece of incoming data at 13. The initial state of the feedback register 12 (i.e., the initial syndrome value 11) is set to an appropriate value for the CRC polynomial that has been selected for use. A checksum generator 16 performs a predetermined operation on the final syndrome value 11 contained in the feedback register 12 after all of the incoming data 13 has been processed. The checksum generator 16 produces a CRC checksum value 17. The checksum value determined by the checksum generator 16 could be associated with (e.g., concatenated with, appended to, etc.) the data 13 for transmission, transfer, storage, etc., together with the data. An example would be a transmit packet having a checksum field associated with its data (payload) portion. The checksum value determined by the checksum generator 16 could be compared to a further checksum value that has been received, retrieved, etc., together with the data 13. An example would be a received packet whose checksum field contains the further checksum value and whose data (payload) portion contains the data 13. Comparison of the further checksum value to the checksum value determined by the checksum generator 16 provides a basis for evaluating the validity of the received data 13.

In some data transmission/transfer/storage applications, the data includes a first portion that is not known before it arrives for processing, and a second portion that is to be added to the first portion. The second portion is already known before the first portion arrives. One example of a known second portion that is added to an unknown first portion can be seen on the transmit side of a conventional PCI Express application. The Transaction Layer Packet (TLP) processing in the Data Link Layer (DLL) module of PCI Express concatenates to an unknown data portion (i.e., the data payload of a PCI Express packet) an associated 16-bit data portion (including a 12-bit TLP Sequence Number) that is already known before the unknown data portion arrives. If the both the unknown and known data portions are to be covered by the checksum at 17 in FIG. 1, then the checksum will cover a larger set of data than if only the unknown data portion were covered by the checksum. As the set of data covered by the checksum increases in size, the amount of time required for the associated CRC processing correspondingly increases.

It is therefore desirable to provide for CRC processing that permits the addition of already-known data to incoming unknown data, while avoiding a corresponding increase in CRC processing time.

DETAILED DESCRIPTION

Figure 1:
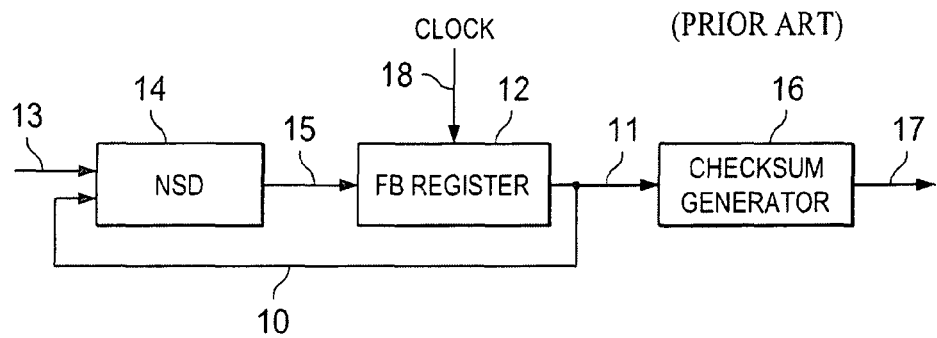
FIG. 1 diagrammatically illustrates the structure and operation of a CRC apparatus according to the prior art.
Figure 2:
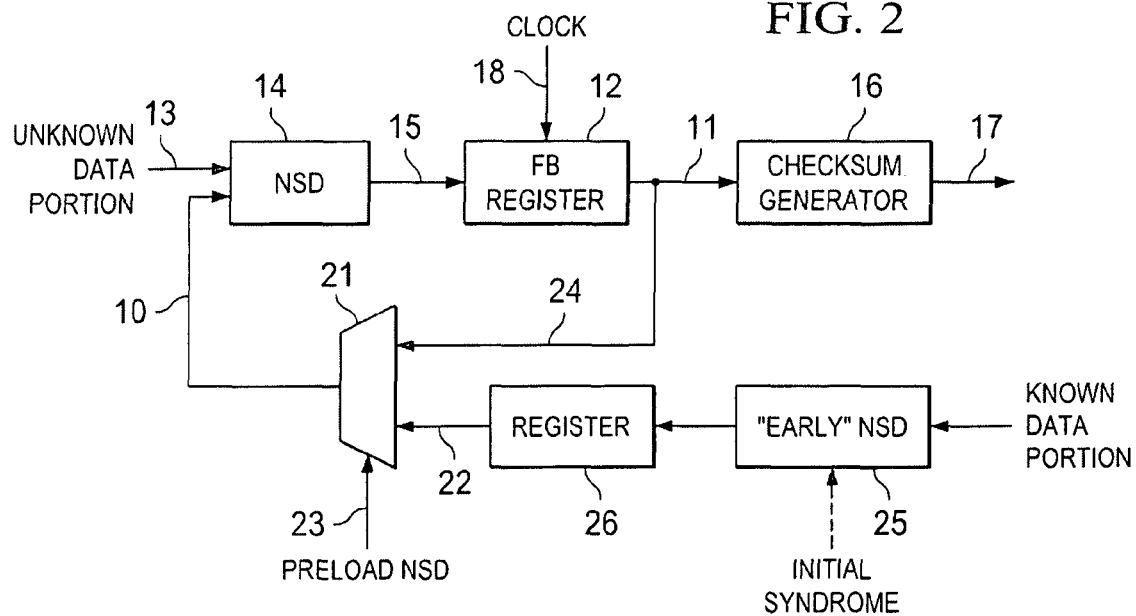
FIG. 2 diagrammatically illustrates the structure and operation of a CRC apparatus according to exemplary embodiments of the invention.

FIG. 2 diagrammatically illustrates the structure and operation of a CRC apparatus according to exemplary embodiments of the invention. The CRC apparatus of FIG. 2 includes structure that is similar to that of FIG. 1. The FIG. 2 apparatus is capable of producing, for use by the checksum generator 16, a final syndrome that corresponds to a set of input data, wherein the set of input data contains (1) a data portion (e.g., the data payload of a PCI Express packet) that is unknown until it arrives for CRC processing, and (2) a data portion (e.g., the aforementioned 16-bit portion associated with PCI Express TLP processing) that is already known before the arrival of the unknown data portion. The apparatus of FIG. 2 includes a selector 21 inserted between the output of the feedback register 12 and the syndrome input 10 of the NSD 14. The output of the selector 21 feeds the syndrome input 10 of the NSD 14. The selector 21 has an input 24 that receives the syndrome 11 currently contained in the feedback register 12, and an input 22 that receives a syndrome output 27 that is produced by an NSD 25 and stored in a register 26. The selector 21 further includes a control input 23 driven by a control signal PRELOAD NSD.

Exemplary embodiments of the invention recognize that the contribution (also referred to herein as the "syndrome contribution") that the known data portion contributes to the aforementioned final syndrome can be produced by simply feeding the known data portion and the selected initial syndrome into a conventional NSD operation. Note, however, that the initial syndrome is a constant that does not change from one set of input data to another. Accordingly, some embodiments implement the NSD operation for the known data portion as a function of the known data portion only. That is, the effect that the (constant) initial syndrome has on the NSD operation is realized within the design of the NSD logic circuitry itself. If the logic circuitry of the NSD 25 is designed in this fashion, then only the known data portion need be provided as input to the NSD 25. In other embodiments, the NSD 25 receives both the known data portion and the initial syndrome (shown by broken line in FIG. 2) as inputs. The syndrome output 27 of the NSD 25 is the syndrome contribution associated with the known data portion.

The selector input 22 provides for the syndrome contribution 27 (as stored in register 26) a path to the syndrome input 10 that is separate from the syndrome feedback path, 15→12→11→24, associated with the NSD 14. In accordance with the control signal PRELOAD NSD, these separate paths provided by the respective selector inputs 22 and 24 are selectively coupled to the syndrome input 10 by the output of the selector 21. In various embodiments, the selector 21 is implemented by a multiplexer or other suitably configured switch or switching circuit.

In some embodiments, at a time before the unknown data portion becomes available for CRC processing, the NSD 25 can already determine the syndrome contribution 27 of the known data portion, because the known data portion is already available for CRC processing (hence the "early" NSD designation for NSD 25 in FIG. 2). With the syndrome contribution 27 already produced by the NSD 25, and stored in register 26, the PRELOAD NSD signal selects input 22 of the selector 21 such that the syndrome contribution stored in the register 26 is "preloaded" to the syndrome input 10 of the NSD 14. Thus, when the unknown data portion eventually becomes available for CRC processing at the data input 13 of the NSD 14, the syndrome contribution produced by the NSD 25 is also available at the syndrome input 10 of the NSD 14.

Accordingly, when the unknown data portion arrives at the data input 13 of the NSD 14, the situation at the NSD 14 is the same as if the known data portion had arrived at 13 together with the unknown data portion, and had already been processed by the NSD 14 (ahead of the unknown data portion), with the syndrome input 10 of the NSD 14 having been initially loaded with the initial syndrome. Upon the arrival of the unknown data portion, CRC processing of the unknown data portion can proceed in conventional fashion, using the NSD 14 and the syndrome feedback path 15→12→11→24. In effect, the NSD 14 uses the syndrome contribution produced by the NSD 25 as an initial syndrome with respect to CRC processing of the unknown data portion. When CRC processing of the unknown data portion commences, the PRELOAD NSD signal selects the selector input 24 to feed the syndrome input 10, thereby enabling CRC processing of the unknown data portion to proceed in conventional fashion using the NSD 14 and the syndrome feedback path 15→12→11→24. When the CRC processing of the unknown data portion is complete, the result in register 12 will be the desired final syndrome for the entire set of input data, i.e., the set consisting of the known data portion and the unknown data portion.

Figure 3:
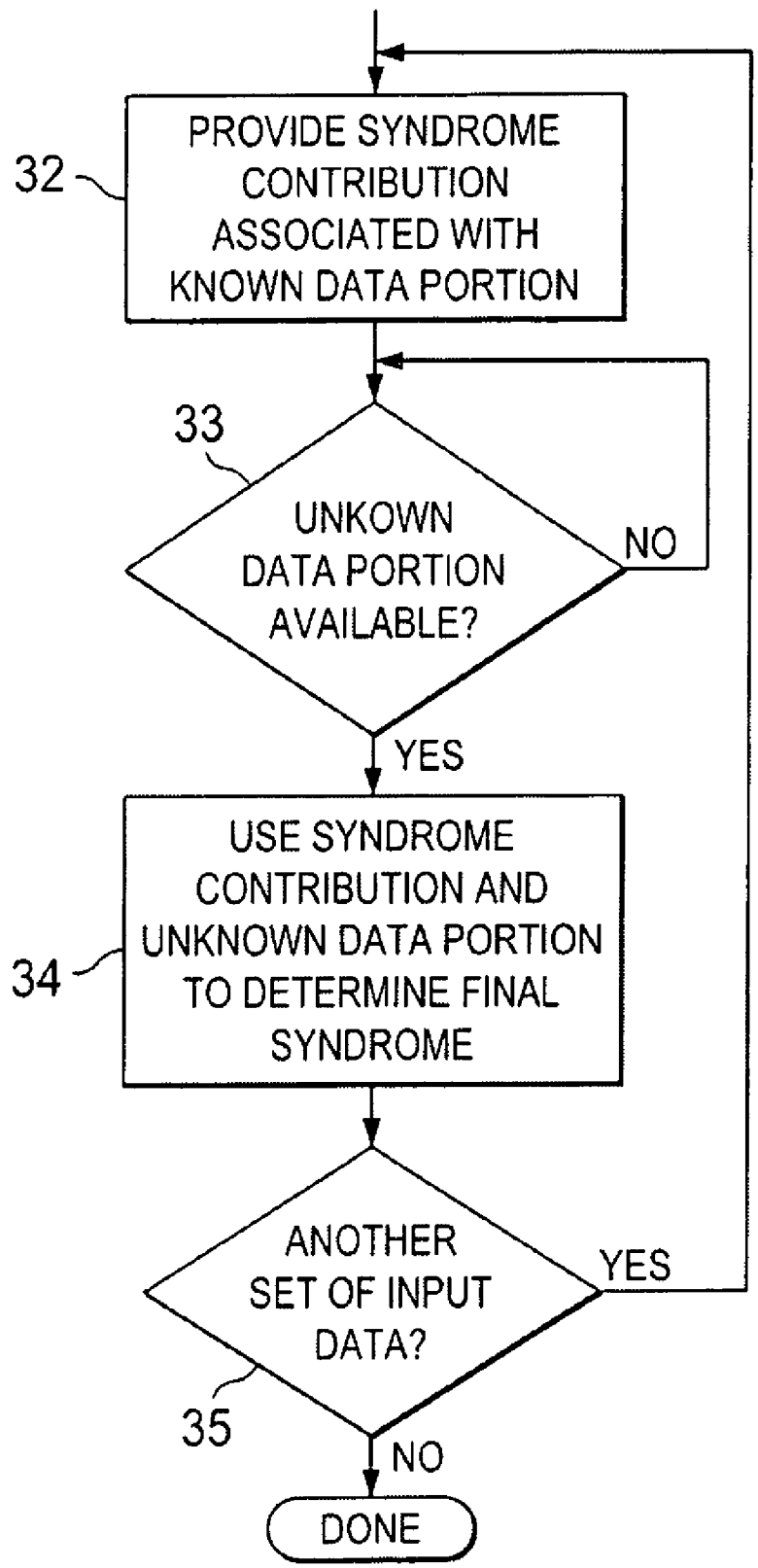
FIG. 3 illustrates operations that can be performed according to exemplary embodiments of the invention.

FIG. 3 illustrates operations that can be performed according to exemplary embodiments of the invention. For example, the apparatus of FIG. 2 is capable of performing the operations of FIG. 3. At 32, the syndrome contribution associated with the known data portion is provided. When it is determined at 33 that the unknown data portion is available, the syndrome contribution from 32 is used at 34, together with the unknown data portion, to determine the final syndrome for the entire set of input data. As shown at 35, the operations 32-34 are repeated until all of the sets of input data have been processed.

As the foregoing description demonstrates, when an already-known data portion is to be added to an incoming unknown data portion, CRC processing can be applied to the resultant set of data with no increase beyond the amount of CRC processing time that would be required for only the unknown data portion.

Although exemplary embodiments of the invention have been described above in detail, this does not limit the scope of the invention, which can be practiced in a variety of embodiments.

What is claimed is:

1. A cyclic redundancy check (CRC) apparatus for processing a set of input data that includes a known data portion and an unknown data portion, comprising:
a first input for receiving said known data portion;
a second input for receiving said unknown data portion;
a first next-state decoder coupled to said first input; and
a second next-state decoder coupled to said second input and said first next-state decoder, said second next-state decoder cooperable with said first next-state decoder to determine a syndrome for said set of input data, said first next-state decoder configured to determine a syndrome contribution that said unknown data portion contributes to said syndrome, and said second next-state decoder configured to determine said syndrome based on said syndrome contribution and said unknown data portion.

2. The apparatus of claim 1, wherein said unknown data portion includes a data payload of a packet, and said known data portion includes a packet sequence number associated with said data payload.

3. The apparatus of claim 1, wherein said first next-state decoder determines said syndrome contribution before said unknown data portion becomes available at said second input.

4. A cyclic redundancy check (CRC) apparatus for processing a set of input data that includes a known data portion and an unknown data portion, comprising:
a first input for receiving said known data portion;
a second input for receiving said unknown data portion;
a first next-state decoder including a data input and a syndrome output, said data input coupled to said first input;
a second next-state decoder including a data input, a syndrome input, and a syndrome output, said data input coupled to said second input, and said syndrome input coupled to said syndrome output of said first next-state decoder; and
a feedback path coupled between said syndrome output and said syndrome input of said second next-state decoder.

5. The apparatus of claim 4, wherein said first next-state decoder determines, and provides at said syndrome output thereof, a syndrome contribution that said known data portion contributes to a syndrome associated with said set of input data.

6. The apparatus of claim 5, wherein said second next-state decoder determines, and provides at said syndrome output thereof, said syndrome based on said syndrome contribution and said unknown data portion.

7. The method of claim 6, wherein said second next-state decoder uses said syndrome contribution as an initial syndrome for CRC processing said unknown data portion.

8. The method of claim 5, wherein said first next-state decoder determines said syndrome contribution based on said known data portion and an initial syndrome selected for CRC processing said set of input data.

9. The apparatus of claim 8, wherein said first next-state decoder includes logic circuitry that implements said initial syndrome.

10. The apparatus of claim 5, wherein said first next-state decoder determines said syndrome contribution before said unknown data portion becomes available at said second input.

11. The apparatus of claim 4, including a selector for coupling a selected one of said feedback path and said syndrome output of said first next-state decoder to said syndrome input of said second next-state decoder.

12. The apparatus of claim 11, including a register coupled between said selector and said syndrome output of said first next-state decoder, and wherein said feedback path includes a register coupled between said selector and said syndrome output of said second next-state decoder.

13. The apparatus of claim 12, wherein said first next-state decoder determines, and provides at said syndrome output thereof, a syndrome contribution that said known data portion contributes to a syndrome associated with said set of input data.

14. The apparatus of claim 13, wherein said second next-state decoder determines, and provides at said syndrome output thereof, said syndrome based on said syndrome contribution and said unknown data portion.

15. The method of claim 14, wherein said second next-state decoder uses said syndrome contribution as an initial syndrome for CRC processing said unknown data portion.

16. The method of claim 13, wherein said first next-state decoder determines said contribution based on said known data portion and an initial syndrome selected for CRC processing said set of input data.

17. The apparatus of claim 13, wherein said first next-state decoder determines said syndrome contribution before said unknown data portion becomes available at said second input.

* * * * *